United States Patent
Saito et al.

(10) Patent No.: US 7,244,974 B2
(45) Date of Patent: Jul. 17, 2007

(54) WIDEBAND GAP POWER SEMICONDUCTOR DEVICE HAVING A LOW ON-RESISTANCE AND HAVING A HIGH AVALANCHE CAPABILITY USED FOR POWER CONTROL

(75) Inventors: Wataru Saito, Kawasaki (JP); Ichiro Omura, Yokohama (JP); Hiromichi Ohashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/191,218

(22) Filed: Jul. 28, 2005

(65) Prior Publication Data

US 2005/0263844 A1  Dec. 1, 2005

Related U.S. Application Data

(62) Division of application No. 10/634,917, filed on Aug. 6, 2003, now Pat. No. 6,940,090.

(30) Foreign Application Priority Data

May 16, 2003  (JP)  ............... 2003-139071

(51) Int. Cl.
  *H01L 29/739*  (2006.01)
(52) U.S. Cl. ..................................... 257/194
(58) Field of Classification Search ................ 257/197, 257/199, 200–201, 183, E29.246, E29.248, 257/E29.252, E21.403, 267, 192–194, 196, 257/E29.247; 438/167, 171
See application file for complete search history.

(56) References Cited

U.S. PATENT DOCUMENTS

| | | | |
|---|---|---|---|
| 5,399,886 A | 3/1995 | Hasegawa | |
| 5,442,205 A | 8/1995 | Brasen et al. | |
| 5,905,277 A | 5/1999 | Ota et al. | |
| 6,064,082 A | 5/2000 | Kawai et al. | |
| 6,483,135 B1 | 11/2002 | Mizuta et al. | |
| 6,548,333 B2* | 4/2003 | Smith | 438/172 |
| 6,555,851 B2 | 4/2003 | Morizuka | |
| 6,593,597 B2* | 7/2003 | Sheu | 257/94 |

(Continued)

FOREIGN PATENT DOCUMENTS

JP  2001-230407  8/2001

OTHER PUBLICATIONS

N.-Q. Zhang, et al., IEEE Electron Device Letters, vol. 21, No. 9, pp. 421-423, "High Breakdown GaN Hemt with Overlapping Gate Structure", Sep. 2000.

(Continued)

*Primary Examiner*—Nathan W. Ha
(74) *Attorney, Agent, or Firm*—Oblon, Spivak, McClelland, Maier & Neustadt, P.C.

(57) ABSTRACT

A power semiconductor device includes a first semiconductor layer, a second semiconductor layer of a first conductivity type, first and second main electrodes, a control electrode and a third semi-conductor layer. The second semiconductor layer is formed on the first semiconductor layer. The first and second main electrodes are formed on the second semiconductor layer separately from each other. The control electrode is formed on the second semiconductor layer between the first and second main electrodes. The third semiconductor layer is formed on the second semiconductor layer between the control electrode and the second main electrode.

11 Claims, 9 Drawing Sheets

U.S. PATENT DOCUMENTS

| | | | |
|---|---|---|---|
| 6,639,255 B2* | 10/2003 | Inoue et al. | 257/194 |
| 6,696,306 B2* | 2/2004 | Makita | 438/20 |
| 6,858,509 B2* | 2/2005 | Delage et al. | 438/315 |
| 7,030,428 B2* | 4/2006 | Saxler | 257/194 |
| 2001/0015437 A1 | 8/2001 | Ishii et al. | |
| 2005/0062069 A1 | 3/2005 | Saito et al. | |
| 2005/0110042 A1 | 5/2005 | Saito et al. | |

OTHER PUBLICATIONS

S. Karmalkar, et al., IEEE Electron Device Letters, vol. 22, No. 8, pp. 373-375, "Resurf AlGaN/GaN Hemt for High Voltage Power Switching", Aug. 2001.

* cited by examiner

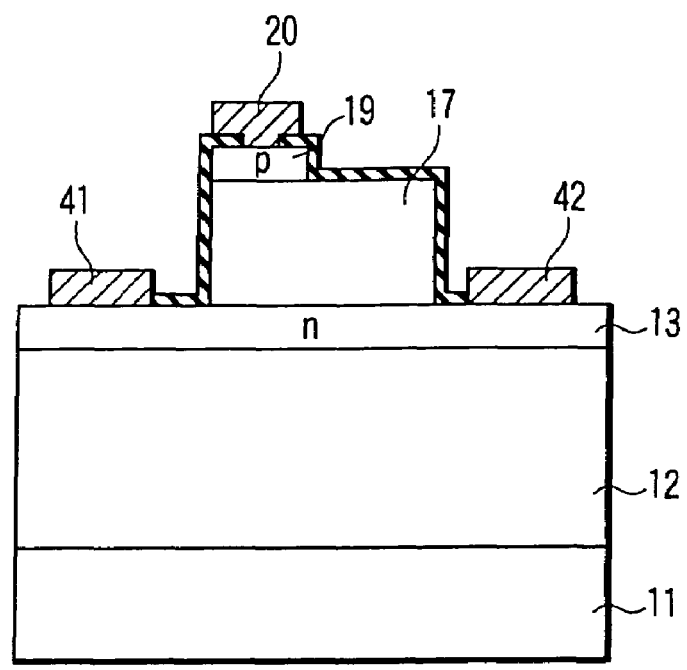
F I G. 23
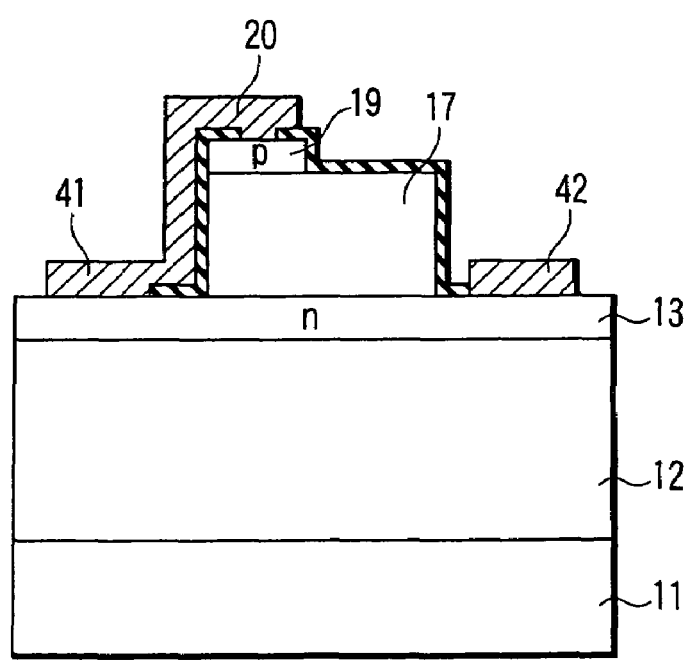
F I G. 24

WIDEBAND GAP POWER SEMICONDUCTOR DEVICE HAVING A LOW ON-RESISTANCE AND HAVING A HIGH AVALANCHE CAPABILITY USED FOR POWER CONTROL

CROSS-REFERENCE TO RELATED APPLICATIONS

This application is based upon and claims the benefit of priority from the prior Japanese Patent Application No. 2003-139071, filed May 16, 2003, and U.S. patent application Ser. No. 10/634,917 filed Aug. 6, 2003, the entire contents of which are incorporated herein by reference.

BACKGROUND OF THE INVENTION

1. Field of the Invention

The present invention relates to a semiconductor device used for power control. More specifically, the invention relates to a horizontal power FET (field-effect transistor) and an SBD (Schottky barrier diode).

2. Description of the Related Art

Conventionally a power semiconductor device such as a switching device and a diode has been used in a switching power supply, an inverter circuit and the like. The power semiconductor device needs to be high in breakdown voltage and low in on-resistance. However, there is a tradeoff, which depends upon device materials, between the breakdown voltage and the on-resistance in the power semiconductor device.

In accordance with the advance of technical development, the on-resistance of a power semiconductor device is lowered to the vicinity of the limit of electrical resistance of silicon that is the principal material of the power semiconductor device. It is thus necessary to change the material in order to lower the on-resistance further. A power semiconductor device has recently been proposed which employs a nitride semiconductor such as gallium nitride (GaN) and aluminum gallium nitride (AlGaN) and a wideband gap semiconductor such as silicon carbide (SiC) as switching device materials. A power semiconductor device using such a wideband gap semiconductor can improve in the above tradeoff that depends upon device materials and dramatically decrease in on-resistance (see, for example, N. -Q. Zhang et al., "High Breakdown GaN HEMT with Overlapping Gate Structure," IEEE Electron Device Letters, Vol. 21, No. 9, September, 2000).

However, when a horizontal power device is formed of a wideband gap semiconductor, if the breakdown voltage of a surface passivation insulating film is low, the breakdown voltage of the device will depend upon the breakdown voltage and the device will be broken the instant that a voltage higher than the breakdown voltage of the surface passivation insulating film is applied to the device. In order to avoid this, the device is designed to decrease the electric field therein and have an adequate breakdown voltage. Such a design however makes it impossible to bring about the capability of the wideband gap semiconductor and results in increase in on-resistance.

The above device has another problem of having no avalanche capability because the device is broken before an avalanche breakdown occurs.

BRIEF SUMMARY OF THE INVENTION

A power semiconductor device according to an aspect of the present invention, comprises a first semiconductor layer, a second semiconductor layer of a first conductivity type formed on the first semi-conductor layer, first and second main electrodes formed on the second semiconductor layer separately from each other, a control electrode formed on the second semiconductor layer between the first and second main electrodes, and a third semiconductor layer formed on the second semiconductor layer between the control electrode and the second main electrode.

A power semiconductor device according to another aspect of the present invention, comprises a first semiconductor layer, a second semiconductor layer of a first conductivity type formed on the first semi-conductor layer, an anode electrode formed on the second semiconductor layer, the anode electrode and the second semiconductor layer forming a Schottky junction, a cathode electrode formed on the second semiconductor layer and electrically connected to the second semiconductor layer, and a third semiconductor layer formed on the second semiconductor layer between the anode electrode and the cathode electrode.

BRIEF DESCRIPTION OF THE SEVERAL VIEWS OF THE DRAWING

FIG. 23 is a cross-sectional view schematically showing a configuration of a horizontal GaN-SBD according to an eleventh embodiment of the present invention; and FIG. 24 is a cross-sectional view schematically showing a configuration of a modification to the horizontal GaN-SBD according to the eleventh embodiment of the present invention.

DETAILED DESCRIPTION OF THE INVENTION

Figure 1:
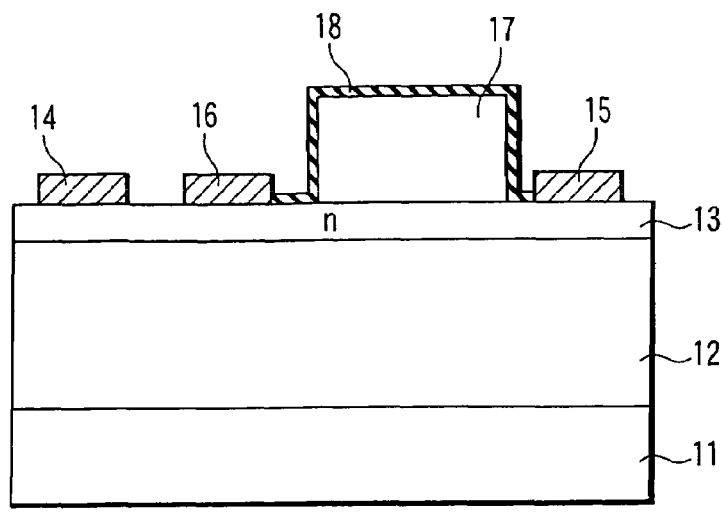
FIG. 1 is a cross-sectional view schematically showing a configuration of a horizontal GaN power HEMT according to a first embodiment of the present invention.

Embodiments of the present invention will now be described with reference to the accompanying drawings. The same elements are indicated by the same reference numerals throughout the drawings.

FIRST EMBODIMENT

First of all, a power semiconductor device according to a first embodiment of the present invention will be described.

FIG. 1 is a cross-sectional view showing a configuration of a horizontal GaN power HEMT according to the first embodiment. The horizontal GaN power HEMT is a power HEMT (high electron mobility transistor) in which source and drain electrodes are formed horizontally on the surface of a substrate and gallium nitride (GaN) is used for a channel layer.

The HEMT has the following configuration. As shown in FIG. 1, an undoped GaN layer 12 of an intrinsic semiconductor (i-type semiconductor) layer is formed as a channel layer on a substrate 11. An n-type AlGaN layer 13 of an n-type semiconductor layer is formed as a barrier layer on the GaN layer 12. For example, SiC or sapphire is used for the substrate 11. The impurity concentration of the GaN layer 12 has only to be $1.0 \times 10^{14}$ cm$^{-3}$ or lower and allows a necessary breakdown voltage to be held in the HEMT.

Source and drain electrodes 14 and 15 are formed on the n-type AlGaN layer 13 separately from each other. A gate electrode 16 is formed on the n-type AlGaN layer 13 between the source and drain electrodes 14 and 15. An undoped GaN layer 17 of an intrinsic semiconductor (i-type semiconductor) layer is formed on the n-type AlGaN layer 13 between the gate and drain electrodes 16 and 15. The surface of the device (the surface of the GaN layer 17) is covered with an insulation film 18, e.g., a SiO$_2$ film deposited by CVD or the like. The source electrode 14, drain electrode 15 and gate electrode 16 are each formed of a multilayer film of Ti/Al/Ni/Au.

The above-described GaN layers 12 and 17 and n-type AlGaN layer 13 are each a semiconductor having a wideband gap of 3 eV or more. The critical field of the wideband gap semiconductor is not less than ten times as high as that of silicon (Si). For example, the critical field of 4H—SiC is $3 \times 10^6$ V/cm, that of GaN is $5 \times 10^6$ V/cm and that of diamond is $8 \times 10^6$ V/cm to $10 \times 10^6$ V/cm.

Since the SiO$_2$ film that forms the insulation film 18 is poor in quality, its breakdown voltage will be lower than that ($1 \times 10^7$ V/cm) of a good-quality thermal oxide film. Thus, the breakdown voltage of the insulation film 18 greatly depends upon the process.

In a conventional wideband gap semiconductor device, the critical fields of a semiconductor layer and a surface passivation film are close to each other; hence, the question of which of the semiconductor layer and the surface passivation film is broken greatly depends upon the quality of an insulation film that forms the surface passivation film. When the insulation film is deposited, there is a possibility that the substrate will warp and the insulation film will crack and come off by stress due to a difference in thermal expansion coefficient between the insulation film and the semiconductor layer. For this reason, there is a limit to the thickness of the insulation film.

Since the power HEMT according to the first embodiment, shown in FIG. 1, employs a nitride semiconductor as a device material, it has a high critical field and a high breakdown voltage. Furthermore, the GaN layer 17 is formed in that portion between the gate and drain to which a high voltage is applied, thereby decreasing the electric field applied to the insulation film 18. Thus, the breakdown voltage of the device does not depend upon the breakdown voltage of the insulation film 18 but the critical field of the semiconductor layer (n-type AlGaN layer 13 or GaN layer 17).

In the configuration of the device according to the first embodiment, a stable critical field can be achieved by forming a surface passivation film by the GaN layer 17 of a crystal growth film. The electric field applied to the insulation film 18 can be weakened by increasing the length of the surface of the semiconductor between the gate and drain, which is covered with the insulation film 18, thereby generating a stable breakdown voltage. Since the crystal growth film is used, no problem of stress occurs but the thickness of the GaN layer 17 can freely be determined.

As one method of increasing the above length of the surface of the semiconductor layer, a trench can be formed between the gate and drain. In this method, however, a drift layer through which current flows will be lengthened and the on-resistance will be increased. In the configuration of the first embodiment, however, no influence is exercised on a drift portion through which current flows and thus a stable breakdown voltage can be generated without increasing the on-resistance.

In the configuration shown in FIG. 1, the gate and drain electrodes 16 and 15 are formed separately from the undoped GaN layer 17. However, the electrodes 16 and 15 can be formed in contact with the layer 17.

As described above, according to the first embodiment, not the insulation film but the GaN layer 17 of a semiconductor layer is formed in that portion between the gate and drain electrodes 16 and 15 to which a high voltage is applied. Consequently, the same critical field as that of the drift portion can be expected and a stable breakdown voltage can be generated.

SECOND EMBODIMENT

A power semiconductor device according to a second embodiment of the present invention will now be described.

Figure 2:
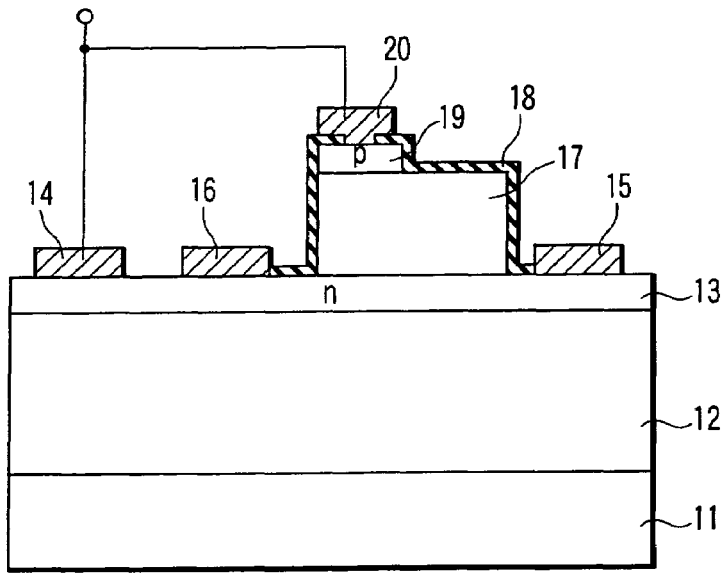
FIG. 2 is a cross-sectional view schematically showing a configuration of a horizontal GaN power HEMT according to a second embodiment of the present invention.

FIG. 2 is a cross-sectional view showing a configuration of a horizontal GaN power HEMT according to the second embodiment. The same elements as those of the first embodiment are indicated by the same reference numerals and their descriptions are omitted. Only different elements will be described below.

As illustrated in FIG. 2, a p-type GaN layer 19 of a p-type semiconductor layer is formed on an undoped GaN layer 17. An insulation film 18 is formed on the undoped GaN layer 17 and p-type GaN layer 19. A field plate electrode 20 is formed on the p-type GaN layer 19 from which the insulation film 18 is removed and electrically connected to a source electrode 14. The electrode 20 is formed of, e.g., a Pt film.

In the semiconductor device so configured, the p-type GaN layer 19 is formed. Therefore, when a high voltage is applied to a drain electrode 15, a junction between the p-type GaN layer 19 and the undoped GaN layer 17 exhibits a high electric field and an avalanche breakdown occurs. The holes caused by the avalanche breakdown are quickly discharged into the p-type GaN layer 19; hence, a high avalanche capability can be achieved.

The field plate electrode 20 formed between the gate and drain is connected to the source electrode 14. Thus, the gate-to-drain capacitance decreases and the switching speed increases.

Figure 3:
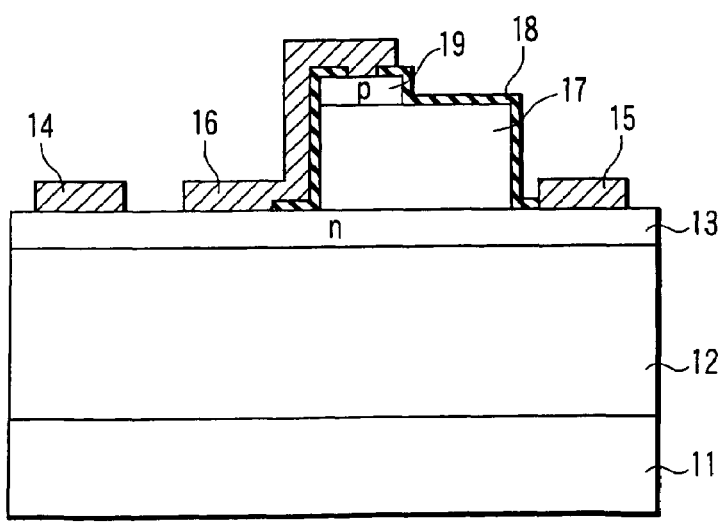
FIG. 3 is a cross-sectional view schematically showing a configuration of a modification to the horizontal GaN power HEMT according to the second embodiment of the present invention.

FIG. 3 is a cross-sectional view of a modification to the second embodiment of the present invention. In the configuration shown in FIG. 2, the field plate electrode 20 is connected to the source electrode 14. In the configuration of the modification shown in FIG. 3, the field plate electrode 20 is connected to the gate electrode 16. This configuration allows the field plate electrode 20 and gate electrode 16 to be formed integrally or by a single deposition and a patterning step. Accordingly, the process can be simplified.

Figure 4:
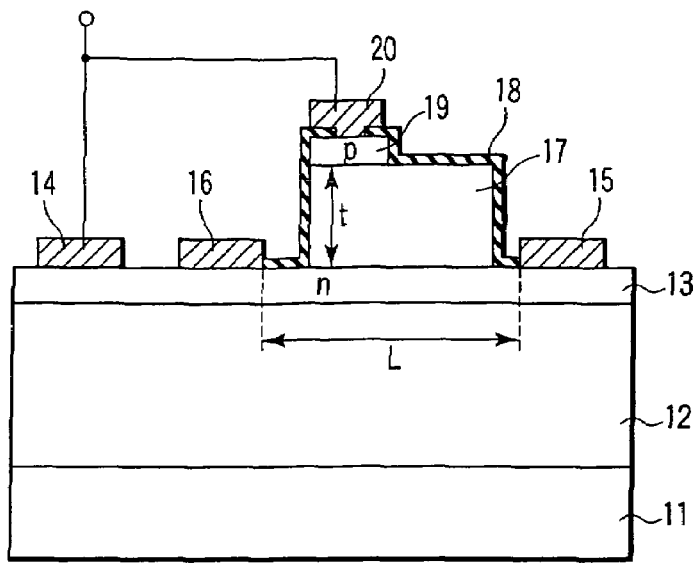
FIG. 4 is a cross-sectional view schematically showing a configuration (and dimensions) of the horizontal GaN power HEMT according to the second embodiment of the present invention.

When the field plate electrode 20 shown in FIGS. 2 and 3 is formed, it is desirable that the thickness t of the undoped GaN layer 17 be smaller than the distance L between the gate and drain as shown in FIG. 4. With this configuration, the electric field generated under the p-type GaN layer 19 alongside the drain electrode 15 becomes greater than that generated near the gate electrode 16. For this reason, an avalanche breakdown occurs near the p-type GaN layer 19 and the holes caused at the time of the avalanche breakdown are quickly discharged into the p-type GaN layer 19. Consequently, a high avalanche capability can be achieved in the configuration shown in FIG. 4.

THIRD EMBODIMENT

A power semiconductor device according to a third embodiment of the present invention will now be described.

Figure 5:
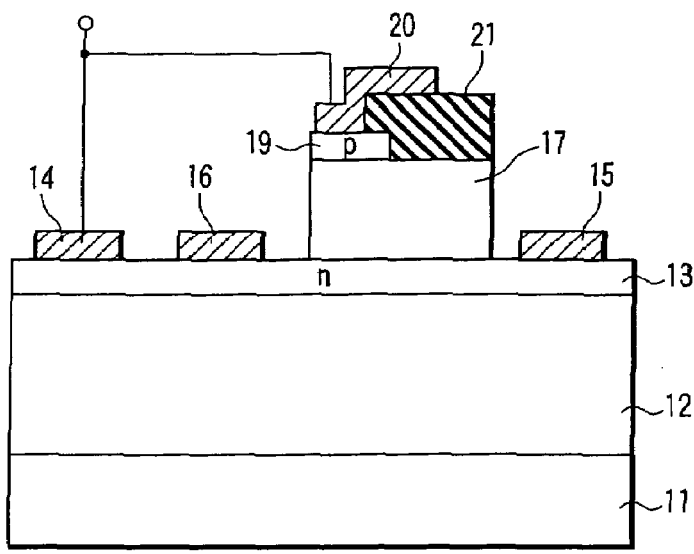
FIG. 5 is a cross-sectional view schematically showing a configuration of a horizontal GaN power HEMT according to a third embodiment of the present invention.

FIG. 5 is a cross-sectional view showing a configuration of a horizontal GaN power HEMT according to the third embodiment. The same elements as those of the second embodiment shown in FIG. 2 are indicated by the same reference numerals and their descriptions are omitted. Only different elements will be described below.

Referring to FIG. 5, a thick insulation film 21 is formed on an undoped GaN layer 17 and part of a p-type GaN layer 19. A field plate electrode 20 is formed on the p-type GaN layer 19 and the insulation film 21.

The third embodiment described above produces the same advantage as that in the case of a two-step field plate structure. In this case, some voltages are applied to the insulation film 21; therefore, it is desirable that the insulation film 21 have such a thickness that it is not broken by the above voltages.

Figure 6:
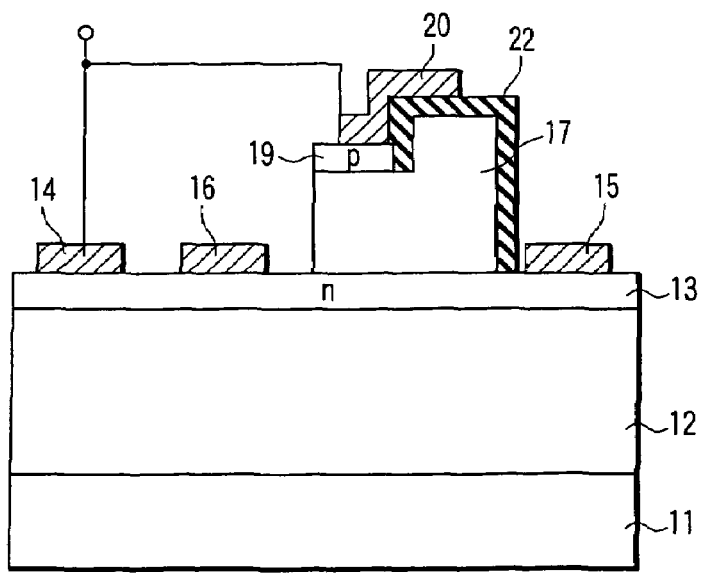
FIG. 6 is a cross-sectional view schematically showing a configuration of a modification to the horizontal GaN power HEMT according to the third embodiment of the present invention.

FIG. 6 is a cross-sectional view of a modification to the third embodiment. As shown in FIG. 6, the undoped GaN layer 17 is formed to have two steps (or to vary in thickness). A field plate electrode 20 is formed on the higher surface of the GaN layer 17 with an insulation film 22 interposed therebetween. The field plate electrode 20 is electrically connected to a source electrode 14.

Even though the thickness of the undoped GaN layer 17 varies in two steps as descried above, the same advantage as that of the second embodiment can be obtained. In this case, a voltage is hardly applied to the insulation film 22 and thus the insulation film 22 has only to be thinner than the insulation film 21.

FOURTH EMBODIMENT

A power semiconductor device according to a fourth embodiment of the present invention will now be described.

Figure 7:
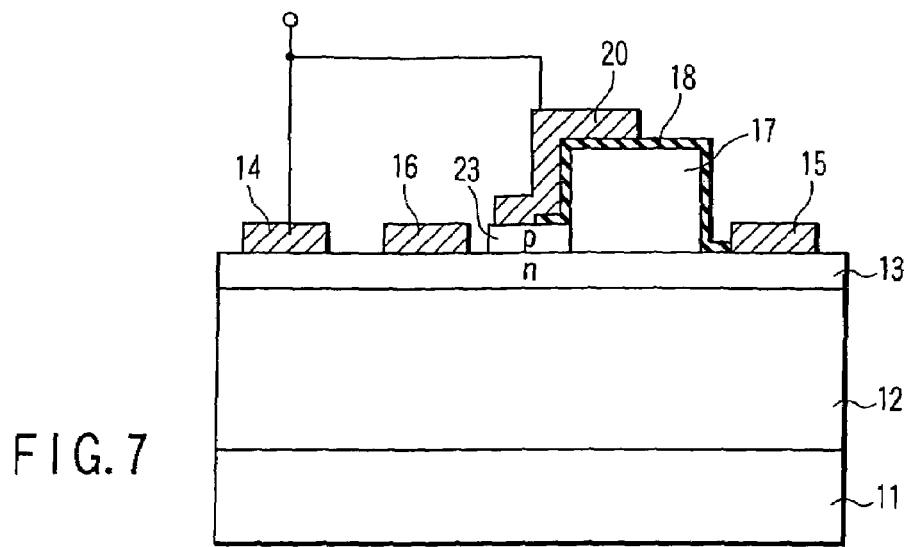
FIG. 7 is a cross-sectional view schematically showing a configuration of a horizontal GaN power HEMT according to a fourth embodiment of the present invention.

FIG. 7 is a cross-sectional view showing a configuration of a horizontal GaN power HEMT according to the fourth embodiment. The same elements as those of the first embodiment shown in FIG. 1 are indicated by the same reference numerals and their descriptions are omitted. Only different elements will be described below.

As shown in FIG. 7, a p-type GaN layer 23 is formed on an n-type AlGaN layer 13, between a gate electrode 16 and an undoped GaN layer 17, and close to the GaN layer 17. An insulation film 18 is formed on the GaN layer 17 and part of the p-type GaN layer 23. Furthermore, a field plate electrode 20 that is electrically connected to a source electrode 14 is formed on the insulation film 18 and p-type GaN layer 23. In other words, the field plate electrode 20 is formed so as to cover the p-type GaN layer 23 and part of the insulation film 18.

In the semiconductor device so configured, the undoped GaN layer 17 is formed under the field plate electrode 20 irrespective of the location of the p-type GaN layer 23. Consequently, the undoped GaN layer 17 performs the same function as that of the insulation film under the field plate electrode 20, thus generating a stable breakdown voltage.

Figure 8:
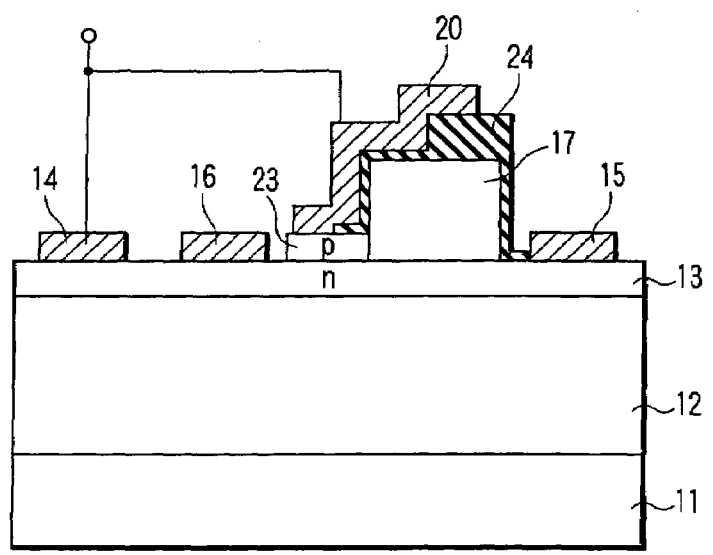
FIG. 8 is a cross-sectional view schematically showing a configuration of a modification to the horizontal GaN power HEMT according to the fourth embodiment of the present invention.

FIG. 8 is a cross-sectional view of a modification to the horizontal GaN power HEMT according to the fourth embodiment. As illustrated in FIG. 8, an insulation film 24 that varies in thickness is formed on the undoped GaN layer 17. A field plate electrode 20 that is electrically connected to the source electrode 14 is formed on the insulation film 24 and the p-type GaN layer 23. Thus, a two-step field plate structure can be formed using the insulation film 24 that varies in thickness.

FIFTH EMBODIMENT

A power semiconductor device according to a fifth embodiment of the present invention will now be described.

Figure 9:
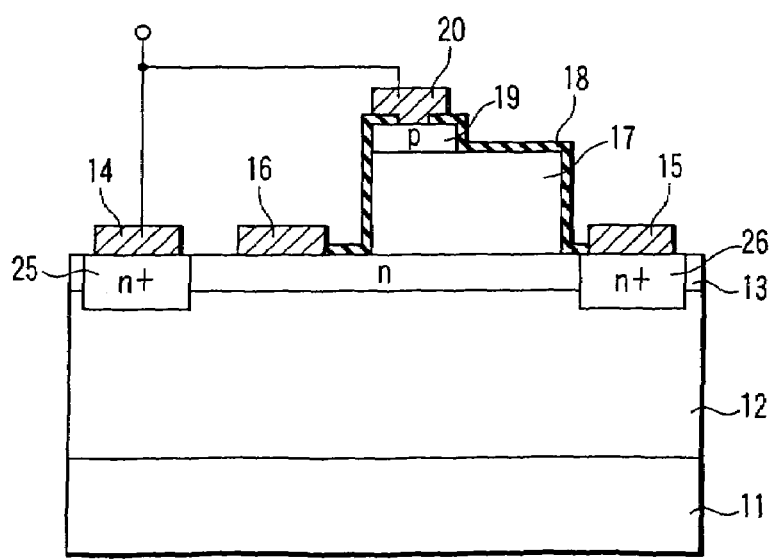
FIG. 9 is a cross-sectional view schematically showing a configuration of a horizontal GaN power HEMT according to a fifth embodiment of the present invention.

FIG. 9 is a cross-sectional view showing a configuration of a horizontal GaN power HEMT according to the fifth embodiment. The same elements as those of the second embodiment shown in FIG. 2 are indicated by the same reference numerals and their descriptions are omitted. Only different elements will be described below.

Referring to FIG. 9, contact layers 25 and 26 are formed under source and drain electrodes 14 and 15, respectively. The contact layers 25 and 26 are each formed of, e.g., an $n^+$-type GaN layer.

In the semiconductor device so configured, the contact layers 25 and 26 allow contact resistance to decrease between each of the source and drain electrodes 14 and 15 and an undoped GaN layer 12. Low on-resistance can thus be achieved.

The contact layers 25 and 26 can be formed by forming a trench in each of the undoped GaN layer 12 and n-type AlGaN layer 13 by etching and then growing the $n^+$-type GaN layer in the trench.

Figure 10:
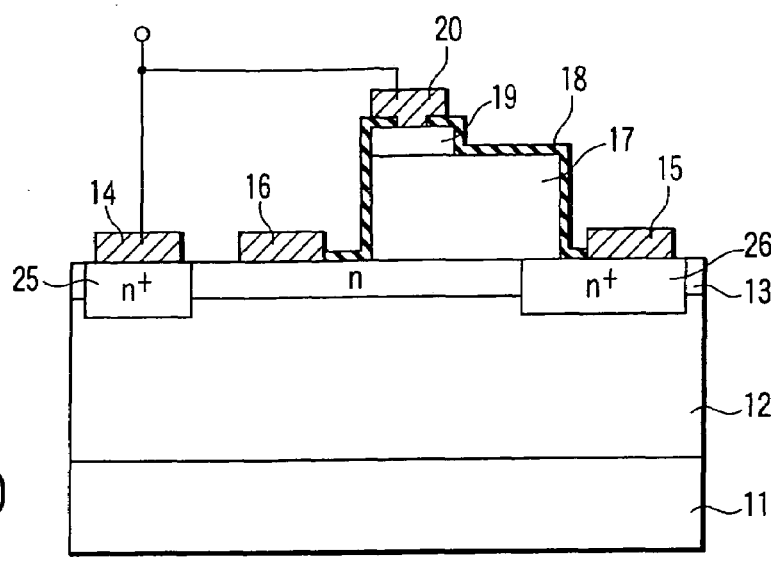
FIG. 10 is a cross-sectional view schematically showing a configuration of a first modification to the horizontal GaN power HEMT according to the fifth embodiment of the present invention.

FIG. 10 is a cross-sectional view of a first modification to the fifth embodiment of the present invention. As shown in FIG. 10, the contact layer 26 and undoped GaN layer 17 are formed so as to overlap each other in their height direction. Since the surface of the contact layer 26 is partly covered with the undoped GaN layer 17, the electric field of the surface of the undoped GaN layer 17 or the electric field of the insulation film 18 is weakened and a stable breakdown voltage can be generated. In this configuration, the undoped GaN layer 17 can be formed by crystal growth by CVD or the like after the contact layers 25 and 26 are formed.

Figure 11:
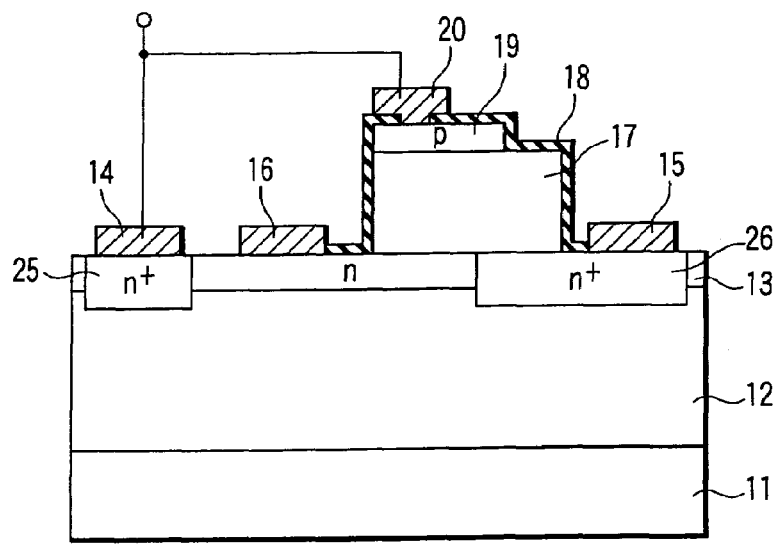
FIG. 11 is a cross-sectional view schematically showing a configuration of a second modification to the horizontal GaN power HEMT according to the fifth embodiment of the present invention.

FIG. 11 is a cross-sectional view of a second modification to the fifth embodiment. As shown in FIG. 11, the p-type GaN layer 19 and contact layer 26 are formed so as to overlap each other in their height direction. In this configuration, the overlapping portion of the layers 19 and 26 exhibits the highest electric field and the electric fields of the undoped GaN layer 17 and insulation film 18, which are located outside the overlapping portion, can be decreased. Thus, the semiconductor device of the second modification can generate a stable breakdown voltage.

Figure 12:
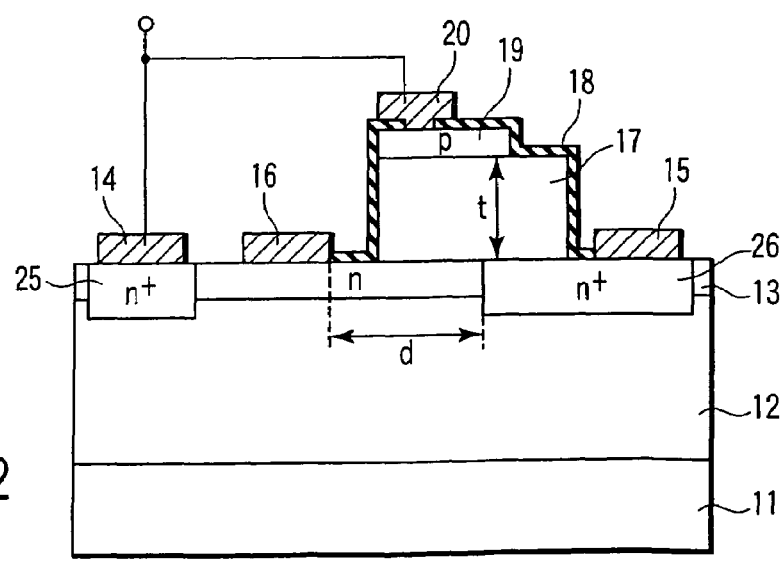
FIG. 12 is a cross-sectional view schematically showing a configuration (and dimensions) of the second modification to the horizontal GaN power HEMT according to the fifth embodiment of the present invention.

In the configuration of the device of the second modification, as shown in FIG. 12, it is desirable that the thickness t of the undoped GaN layer 17 be smaller than the distance d between the gate electrode 16 and the contact layer 26. The electric field generated under the p-type GaN layer 19 alongside the drain electrode 15 becomes greater than the electric field generated close to the gate electrode, and the holes generated at the time of an avalanche breakdown are quickly discharged into the p-type GaN layer 19. Consequently, a high avalanche capability can be achieved in the configuration shown in FIG. 12.

In the configurations shown in FIGS. 9 to 12, the contact layers 25 and 26 are buried into the n-type AlGaN layer 13. However, these contact layers 25 and 26 can selectively be formed on the n-type AlGaN layer 13.

SIXTH EMBODIMENT

A power semiconductor device according to a sixth embodiment of the present invention will now be described.

Figure 13:
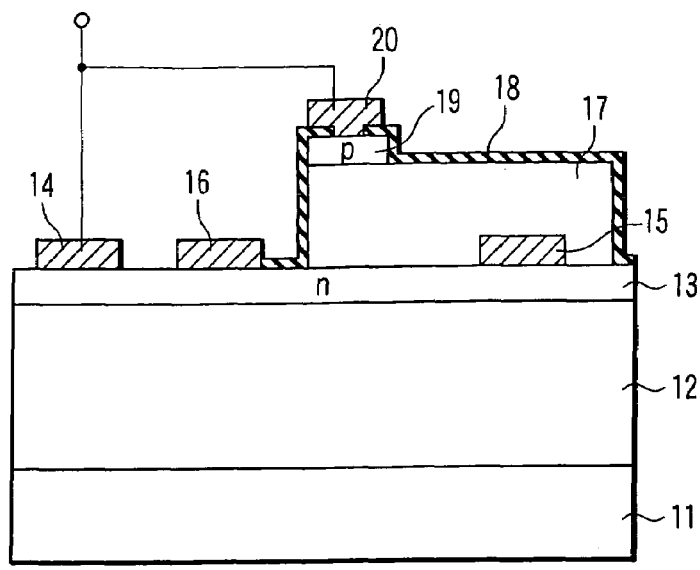
FIG. 13 is a cross-sectional view schematically showing a configuration of a horizontal GaN power HEMT according to a sixth embodiment of the present invention.

FIG. 13 is a cross-sectional view showing a configuration of a horizontal GaN power HEMT according to the sixth embodiment. The same elements as those of the second embodiment shown in FIG. 2 are indicated by the same reference numerals and their descriptions are omitted. Only different elements will be described below.

As illustrated in FIG. 13, a drain electrode 15 is covered with an undoped GaN layer 17. More specifically, the drain electrode 15 is formed on an n-type AlGaN layer 13 and the undoped GaN layer 17 is formed on the drain electrode 15. A p-type GaN layer 19 is formed on part of the undoped GaN layer 17 and an insulation film 18 is formed on the undoped GaN layer 17 and p-type GaN layer 19. Moreover, a field plate electrode 20 is formed on the p-type GaN layer 19 from which the insulation film 18 is removed. The field plate electrode 20 is electrically connected to a source electrode 14.

In the power semiconductor device so configured, the electric field that is applied to the insulation film 18 deposited on the surface of the undoped GaN layer 17 can be almost zero. The breakdown voltage of the device therefore completely depends upon the semiconductor layer of the undoped GaN layer 17 or the n-type AlGaN layer 13. The configuration can be obtained by forming the drain electrode 15 by high-melting metal such as tungsten (W) and then growing the undoped GaN layer 17 on the drain electrode 15.

Figure 14:
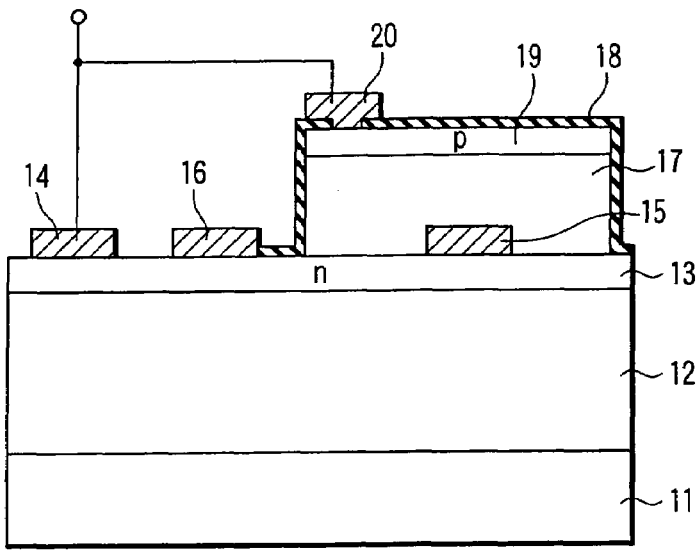
FIG. 14 is a cross-sectional view schematically showing a configuration of a first modification to the horizontal GaN power HEMT according to the sixth embodiment of the present invention.

FIG. 14 is a cross-sectional view of a first modification to the sixth embodiment. As shown in FIG. 14, the drain electrode 15 and p-type GaN layer 17 are formed so as to overlap each other in their height direction. In other words, the drain electrode 15 is completely covered with the p-type GaN layer 19. If the drain electrode 15 is done so, a high-voltage section is confined within crystal (GaN layer 17); therefore, a voltage is hardly applied to the insulation film 18 outside the layer 17. Consequently, the materials for the insulation film 18 formed on the GaN layer 17 can be selected considerably freely.

Figure 15:
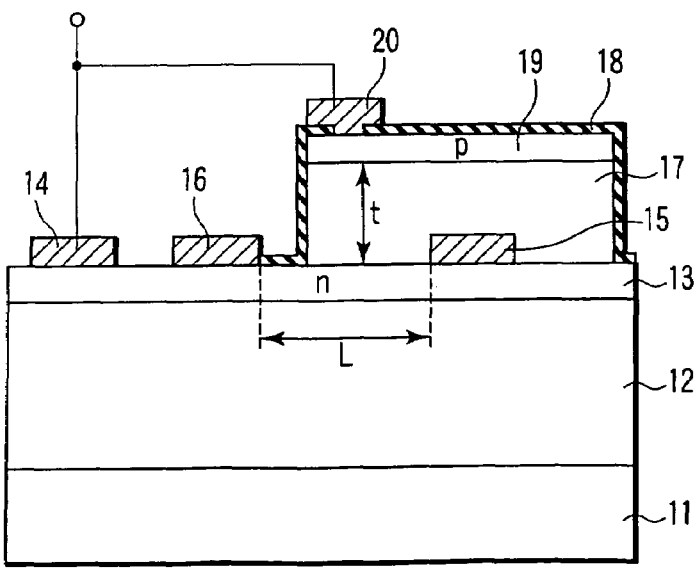
FIG. 15 is a cross-sectional view schematically showing a configuration (and dimensions) of the first modification to the horizontal GaN power HEMT according to the sixth embodiment of the present invention.

In the configuration of the first modification, as shown in FIG. 15, it is desirable that the thickness t of the undoped GaN layer 17 be smaller than the distance between the gate and drain electrodes 16 and 15. Thus, the breakdown voltage of the device depends upon the thickness t of the undoped GaN layer 17 and the breakdown voltage can precisely be controlled by the undoped GaN layer 17 of a crystal growth film.

SEVENTH EMBODIMENT

A power semiconductor device according to a seventh embodiment of the present invention will now be described.

Figure 16:
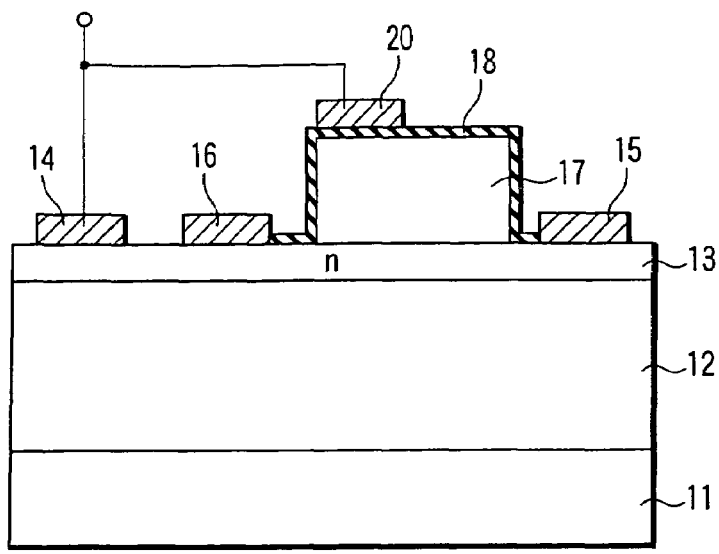
FIG. 16 is a cross-sectional view schematically showing a configuration of a horizontal GaN power HEMT according to a seventh embodiment of the present invention.

FIG. 16 is a cross-sectional view showing a configuration of a horizontal GaN power HEMT according to the seventh embodiment. The same elements as those of the first embodiment shown in FIG. 1 are indicated by the same reference numerals and their descriptions are omitted. Only different elements will be described below.

Referring to FIG. 16, an insulation film 18 is deposited on the surface of an undoped GaN layer 17. A field plate electrode 20 is selectively formed on the insulation film 18. The field plate electrode 20 is connected to a source electrode 14.

In the power semiconductor device so configured, the undoped GaN layer 17 is formed on an n-type AlGaN layer 13 and thus an electric field applied to the insulation film 18 can be lessened. Moreover, the field plate electrode 20 is formed on the insulation film 18 and thus a leakage current flowing from the field plate electrode 20 into the undoped GaN layer 17 can be reduced to an extreme.

In the configuration shown in FIG. 16, the field plate electrode 20 is electrically connected to the source electrode 14. The gate-to-drain capacitance can be decreased and the switching speed can be improved. As compared with the configuration including the p-type GaN layer 19, an avalanche capability is lowered but a stable breakdown voltage can be generated and the process can be simplified.

In the configuration shown in FIG. 16, the field plate electrode 20 is formed on the insulation film 18. However, the field plate electrode 20 can directly be formed on the undoped GaN layer 17 to form a Schottky barrier between the undoped GaN layer 17 and the field plate electrode 20. In this case, the leakage current from the field plat electrode 20 increases, but the advantage of lessening the electric field applied to the insulation film 18 formed on the surface of the device can be obtained.

Figure 17:
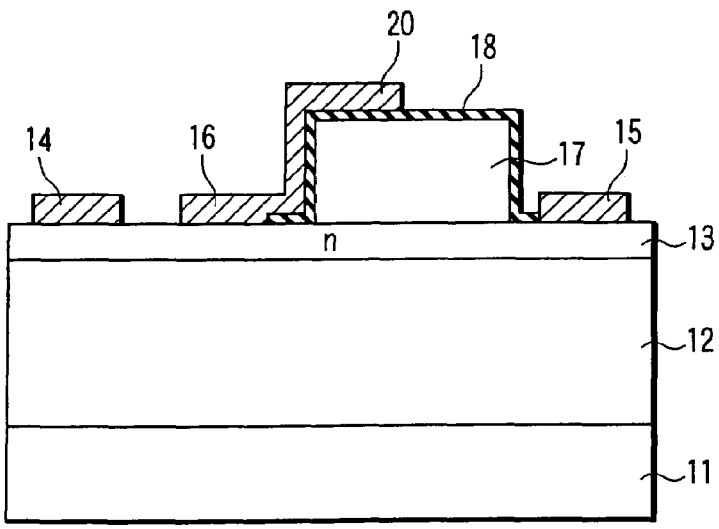
FIG. 17 is a cross-sectional view schematically showing a configuration of a first modification to the horizontal GaN power HEMT according to the seventh embodiment of the present invention.

FIG. 17 is a cross-sectional view of a first modification to the seventh embodiment of the present invention. As illustrated in FIG. 17, the field plate electrode 20 is formed integrally with the gate electrode 16 as one component and these electrodes 20 and 16 are electrically connected to each other. The integral formation therefore simplifies the process.

EIGHTH EMBODIMENT

A power semiconductor device according to an eighth embodiment of the present invention will now be described.

Figure 18:
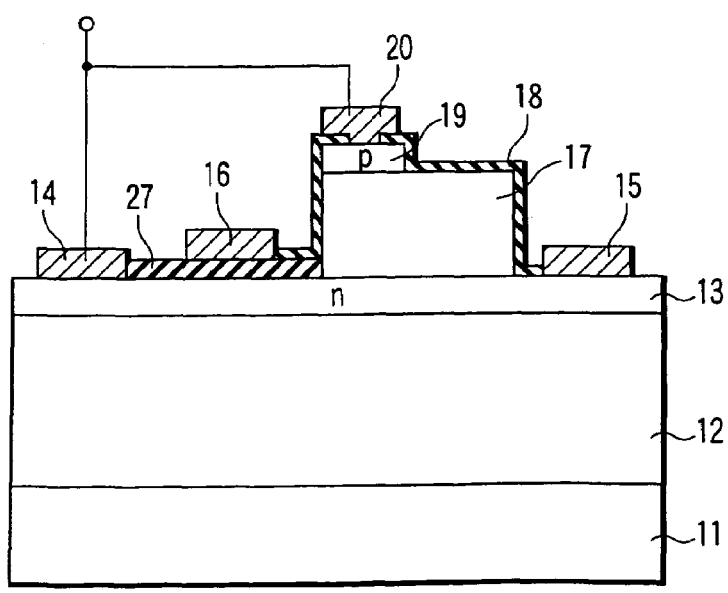
FIG. 18 is a cross-sectional view schematically showing a configuration of a horizontal GaN power HEMT according to an eighth embodiment of the present invention.

FIG. 18 is a cross-sectional view showing a configuration of a horizontal GaN power HEMT according to the eighth embodiment. The same elements as those of the second embodiment shown in FIG. 2 are indicated by the same reference numerals and their descriptions are omitted. Only different elements will be described below.

As shown in FIG. 18, a gate insulation film 27 is formed under a gate electrode 16. Thus, a gate leakage current can be reduced drastically and consequently a loss of a gate driving circuit can be decreased. The gate insulation film 27 is formed of AlGaOx obtained by oxidizing an AlGaN layer, SiN, AlN and $Al_2O_3$ that are deposited, and the like.

NINTH EMBODIMENT

A power semiconductor device according to a ninth embodiment of the present invention will now be described.

Figure 19:
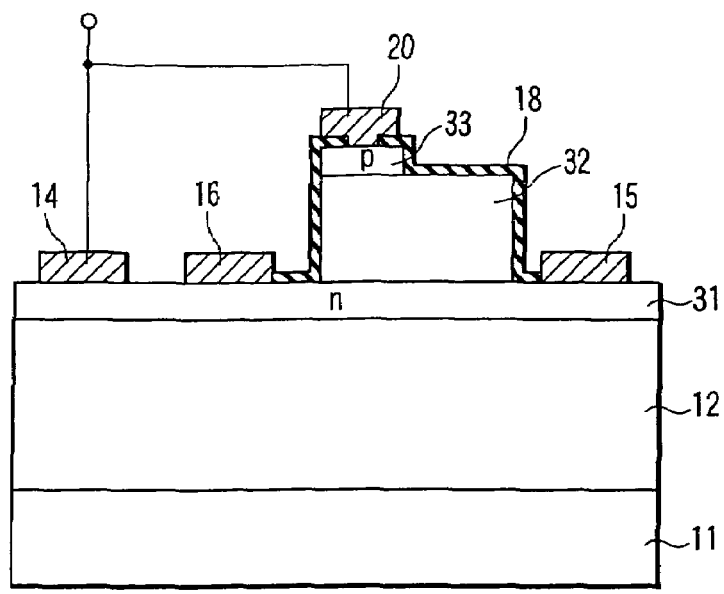
FIG. 19 is a cross-sectional view schematically showing a configuration of a horizontal GaN power HEMT according to a ninth embodiment of the present invention.

FIG. 19 is a cross-sectional view showing a configuration of a horizontal GaN power HEMT according to the ninth embodiment. As the power HEMTs according to the first to eighth embodiments, the power HEMT according to the ninth embodiment is formed to have a heterojunction of n-type AlGaN/GaN.

As illustrated in FIG. 19, an undoped GaN layer 12 of an intrinsic semiconductor (i-type semiconductor) layer is formed as a channel layer on a substrate 11. An n-type $Al_{0.1}Ga_{0.9}N$ layer 31 of an n-type semiconductor layer is formed as a barrier layer on the GaN layer 12. For example, SiC or sapphire is used for the substrate 11. The impurity concentration of the GaN layer 12 has only to be $1.0 \times 10^{14}$ $cm^{-3}$ or lower and allows a necessary breakdown voltage to be held in the HEMT.

Source and drain electrodes 14 and 15 are formed on the n-type $Al_{0.1}Ga_{0.9}N$ layer 31 separately from each other. A gate electrode 16 is formed on the n-type $Al_{0.1}Ga_{0.9}N$ layer 31 between the source and drain electrodes 14 and 15. An undoped $Al_{0.1}Ga_{0.9}N$ layer 32 is formed on the n-type $Al_{0.1}Ga_{0.9}N$ layer 31 between the gate and drain electrodes 16 and 15.

A p-type AlGaN layer 33 of a p-type semiconductor layer is formed on the undoped $Al_{0.1}Ga_{0.9}N$ layer 32 and the device surface (the surface of the undoped $Al_{0.1}Ga_{0.9}N$ layer 32 and that of the p-type AlGaN layer 33) is covered with an insulation film 18. The insulation film 18 formed on the p-type AlGaN layer 33 is partly removed and a field plate electrode 20 is formed on the p-type AlGaN layer 33 from which the insulation film 18 is removed. Furthermore, the field plate electrode 20 and source electrode 14 are electrically connected to each other.

In the power semiconductor device so configured, if the percentage of Al in the n-type AlGaN layer 31 and that of Al in the undoped AlGaN layer 32 are made equal to each other, electrons quickly flow into the n-type AlGaN layer 31 to achieve a high avalanche capability even when an avalanche breakdown occurs in the undoped AlGaN layer 32.

According to the first to eighth embodiments shown in FIGS. 1 to 18, a gate-to-drain semiconductor layer is formed of the undoped GaN layer 17. Lattice distortion is therefore small and the undoped GaN layer 17 can be thickened by crystal growth. In the ninth embodiment, if the percentage of Al in the undoped AlGaN layer 32 between the gate and drain increases, lattice distortion becomes large and thus a crack is easy to occur. However, the undoped AlGaN layer 32 needs to be thickened to some extent in order to maintain the breakdown voltage.

Figure 20A:
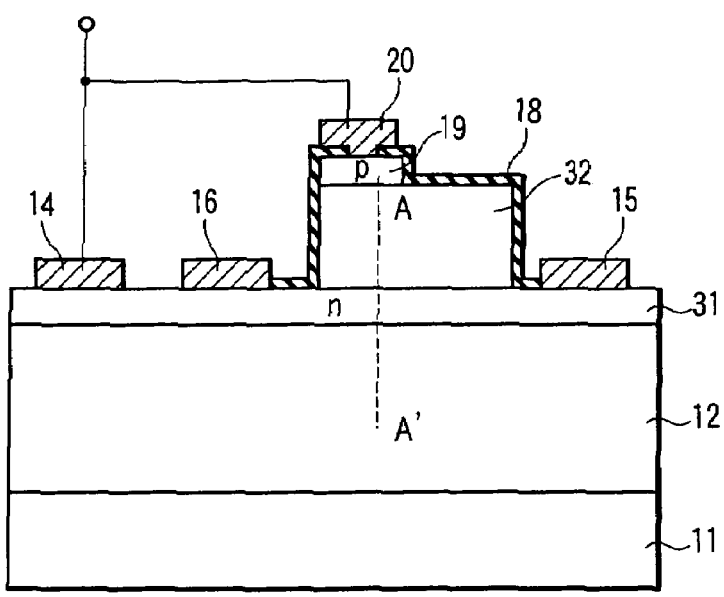
FIG. 20A is a cross-sectional view schematically showing a configuration of the horizontal GaN power HEMT according to the ninth embodiment of the present invention.
Figure 20B:
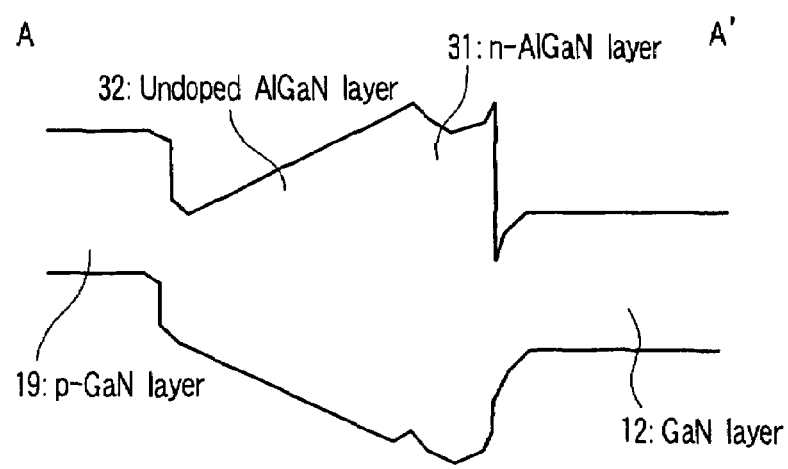
FIG. 20B is a band gap chart taken along line A-A' of FIG. 20A.

As shown in the band gap chart in FIG. 20B, if the percentage of Al in the undoped AlGaN layer 32 gradually decreases toward the p-type AlGaN layer 33, it is possible to achieve a configuration that eliminates band discontinuity between the AlGaN layer 32 and n-type AlGaN layer 31 while maintaining the same lattice distortion as that caused when the percentage of Al is equivalently small. The band gap chart shown in FIG. 20B corresponds to a section taken along line A-A' in FIG. 20A.

Figure 21:
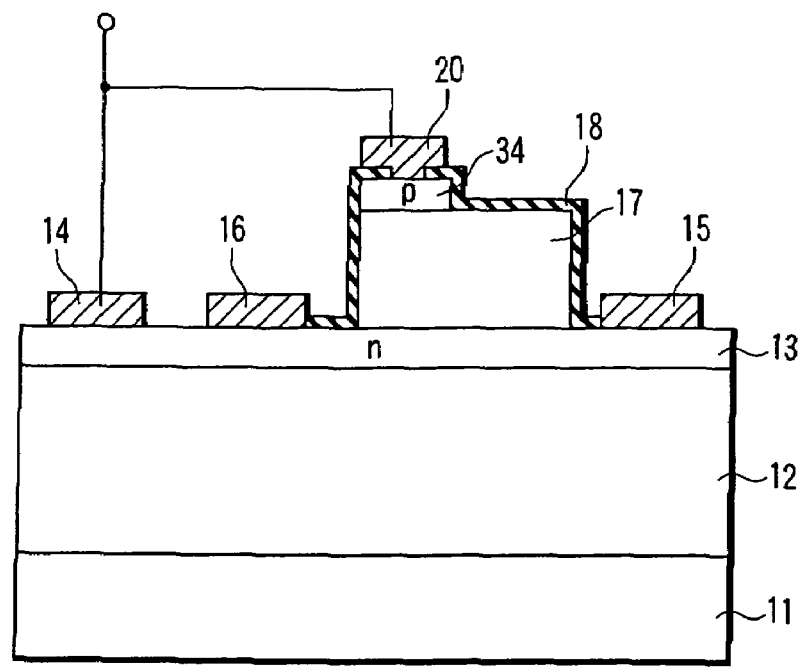
FIG. 21 is a cross-sectional view schematically showing a configuration of a modification to the horizontal GaN power HEMT according to the ninth embodiment of the present invention.

FIG. 21 is a cross-sectional view of a modification to the ninth embodiment. As illustrated in FIG. 21, a p-type GaInN layer 34 of a p-type semiconductor layer is formed on an undoped GaN layer 17. In this configuration, since the p-type GaInN layer 34 has a band gap that is narrower than that of a GaN layer, there is no barrier to the holes. Consequently, the holes caused at the time of an avalanche breakdown can quickly be discharged and an avalanche capability can be increased more than that in the configuration including a GaN layer.

TENTH EMBODIMENT

A power semiconductor device according to a tenth embodiment of the present invention will now be described. The tenth embodiment is directed to an example of a horizontal power MISFET using diamond.

Figure 22:
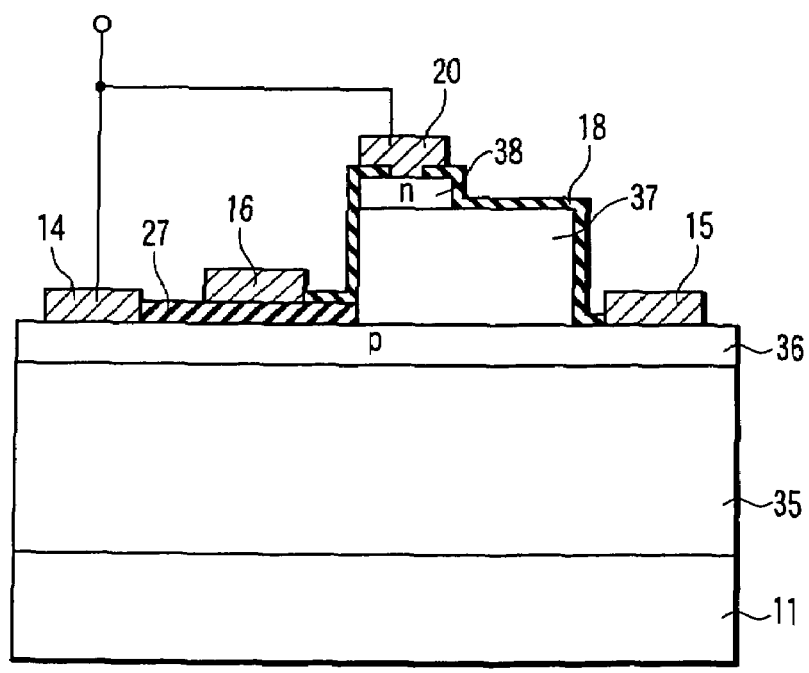
FIG. 22 is a cross-sectional view schematically showing a configuration of a horizontal GaN power HEMT according to a tenth embodiment of the present invention.

FIG. 22 is a cross-sectional view showing a configuration of the horizontal diamond MISFET according to the tenth embodiment.

The configuration of the MISFET is as follows. As shown in FIG. 22, an undoped diamond layer 35 of an intrinsic semiconductor (i-type semiconductor) is formed as a channel layer on a substrate 11. A p-type diamond layer 36 of a p-type semiconductor layer is formed as a barrier layer on the undoped diamond layer 35. The substrate 11 is formed using diamond and the like. The impurity concentration of the undoped diamond layer 35 has only to be $1.0 \times 10^{14}$ cm$^{-3}$ or lower and allows a necessary breakdown voltage to be held in the MISFET.

Source and drain electrodes 14 and 15 are formed on the p-type diamond layer 36 separately from each other. A gate insulation film 27 is formed on the p-type diamond layer 36 between the source and drain electrodes 14 and 15. A gate electrode 16 is formed on the gate insulation film 27. An undoped diamond layer 37 of an intrinsic semiconductor (i-type semiconductor) layer is formed on the p-type diamond layer 36 between the gate and drain electrodes 16 and 15.

An n-type diamond layer 38 of an n-type semiconductor layer is formed on the undoped diamond layer 37. An insulation film 18 is formed on the undoped diamond layer 37 and n-type diamond layer 38 (device surface). The insulation film 18 is partly removed from the surface of the n-type diamond layer 38 and a field plate electrode 20 is formed on the n-type diamond layer 38 from which the insulation film 18 is removed. The field plate electrode 20 is electrically connected to the source electrode 14.

Even in the tenth embodiment that is directed to a horizontal power MISFET or MESFET formed using diamond, the critical field of a semiconductor layer can be increased as in the GaN-HEMT described above. Since, however, the breakdown voltage of an insulation film formed on the device surface greatly depends upon the process and materials, it is difficult to fully bring about the capability of the semiconductor layer. Therefore, even in the MISFET using diamond, a stable breakdown voltage can be generated by forming the undoped diamond layer 37 serving as an insulation film under the field plate electrode 20.

The MISFET according to the tenth embodiment can also be configured to have a heterojunction of AlGaN/GaN, such as the foregoing field plate electrode, a contact layer and a two-step field plate structure.

ELEVENTH EMBODIMENT

A power semiconductor device according to an eleventh embodiment of the present invention will now be described.

FIG. 23 is a cross-sectional view showing a configuration of a horizontal GaN-SBD according to the eleventh embodiment. The horizontal GaN-SBD is a power Schottky barrier diode in which anode and cathode electrodes are horizontally formed on the surface of a substrate and a channel layer is formed of gallium nitride (GaN).

The configuration of the SBD is as follows. As illustrated in FIG. 23, an undoped GaN layer 12 of an intrinsic semiconductor (i-type semiconductor) layer is formed as a channel layer on a substrate 11. An n-type AlGaN layer 13 of an n-type semiconductor layer is formed as a barrier layer on the GaN layer 12. The substrate 11 is formed of SiC, sapphire or the like. The impurity concentration of the GaN layer 12 has only to be $1.0 \times 10^{14}$ cm$^{-3}$ or lower and allows a necessary breakdown voltage to be held in the SBD.

Anode and cathode electrodes 41 and 42 are formed on the n-type AlGaN layer 13 separately from each other. An undoped GaN layer 17 of an intrinsic semiconductor (i-type semiconductor) layer is formed on the n-type AlGaN layer 13 between the anode and cathode electrodes 41 and 42. Furthermore, a p-type GaN layer 19 of a p-type semiconductor layer is formed on the undoped GaN layer 17. The undoped GaN layer 17 and p-type GaN layer 19 (device surface) are covered with an insulation film 18. The insulation film 18 is partly removed from the surface of the p-type GaN layer 19 and a field plate electrode 20 is formed on the p-type GaN layer 19 from which the insulation film 18 is removed.

In the SBD so configured, the field plate electrode 20 is formed in order to prevent a breakdown voltage from lowering between the anode and cathode electrode 41 and 42. As in the foregoing power HEMT, the undoped GaN layer 17 serving as an insulation film is formed under the field plate electrode 20. Thus, a high breakdown voltage SBD can be achieved while maintaining a low on-resistance.

FIG. 24 shows a section of a modification to the power semiconductor device according to the eleventh embodiment. Referring to FIG. 24, the field plate electrode 20 is formed integrally with the anode electrode 41 as one component and these electrodes 20 and 41 are electrically connected to each other.

As described above, the integral formation of the field plate electrode 20 and anode electrode 41 simplifies the process. The holes generated at the time of an avalanche breakdown are quickly discharged into the anode electrode 41 from the field plate electrode 20. Consequently, a high avalanche capability can be achieved.

In the configurations shown in FIGS. 23 and 24, it is desirable that the thickness of the undoped GaN layer 17 be smaller than the distance between the anode and cathode electrodes 41 and 42 in order to control the breakdown voltage with reliability.

The eleventh embodiment is directed to an SBD using GaN in a semiconductor layer. However, it can be applied to an SBD using diamond.

As described above, according to the embodiments of the present invention, there can be provided a power semiconductor device capable of bringing about the capability of a wideband gap semiconductor device to achieve a low on-resistance and having a high avalanche capability. In other words, there can be provided a high breakdown voltage, very low on-resistance, horizontal wideband gap semiconductor device having a stable breakdown voltage and a high avalanche capability.

The present invention is not limited to the above first to eleventh embodiments. It can be applied to all of modifications that can easily be obtained by the inventor(s) of the present invention.

The device is formed to have a heterojunction of AlGaN/GaN; however, it can be formed to have a heterojunction of AlGaInN/GaInN containing In. The relationship in band gap between the respective layers in the HEMT structure can be established. Moreover, the substrate serving to form an AlGaIn heterojunction can be formed of GaN and Si as well as SiC and sapphire.

The embodiments of the present invention are not limited to an HEMT, an MESFET, an MISFET or an SBD but can be applied to a unipolar device such as a JFET and a bipolar device such as a pin diode and an IGBT if the device is a horizontal one.

According to the embodiments of the present invention described above, there can be provided a power semiconductor device having a high avalanche capability and capable of achieving a high breakdown voltage and a low on-resistance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A power semiconductor device comprising:
   a first semiconductor layer having a band gap of 3 eV or more;
   a second semiconductor layer of a first conductivity type formed on the first semiconductor layer, the second semiconductor layer having a band gap of 3 eV or more;
   first and second main electrodes formed on the second semiconductor layer separately from each other;
   a control electrode formed on the second semiconductor layer between the first main electrode and the second main electrode; and
   a third semiconductor layer formed on the second semiconductor layer between the control electrode and the second main electrode, the third semiconductor layer having a band gap of 3 eV or more,
   a fourth semiconductor layer of a second conductivity type formed on the third semiconductor layer, the fourth semiconductor layer having a band gap of 3 eV or more; and
   a field plate electrode formed on the fourth semiconductor layer,
   wherein the first semiconductor layer and the second semiconductor layer form a heterojunction, the second semiconductor layer has a band gap that is wider than that of the first semiconductor layer, the third semiconductor layer has a band gap that varies in a depth direction thereof, and the third semiconductor layer has a band gap that is wider than that of the fourth semiconductor layer.

2. The power semiconductor device according to claim 1, wherein the first semiconductor layer includes GaInN and the second semiconductor layer includes AlGaInN.

3. The power semiconductor device according to claim 1, further comprising:
   an insulation film formed on the third semiconductor layer, wherein the field plate electrode is formed on the insulation film.

4. The power semiconductor device according to claim 1, wherein the field plate electrode is connected to one of the first main electrode and the control electrode.

5. The power semiconductor device according to claim 1, further comprising a fifth semiconductor layer of the first conductivity type formed under the second main electrode.

6. The power semiconductor device according to claim 5, wherein the third semiconductor layer and the fifth semiconductor layer are arranged so as to overlap each other in a height direction thereof.

7. The power semiconductor device according to claim 6, wherein the fourth semiconductor layer and the fifth semiconductor layer are arranged so as to overlap each other in a height direction thereof.

8. The power semiconductor device according to claim 7, wherein the third semiconductor layer has a thickness that is smaller than a distance between the control electrode and the fifth semiconductor layer.

9. The power semiconductor device according to claim 1, wherein the first, second, third and fourth semiconductor layers are each formed of diamond.

10. The power semiconductor device according to claim 1, wherein the first and third semiconductor layers are each formed of an intrinsic semiconductor.

11. The power semiconductor device according to claim 1, wherein the first semiconductor layer includes GaN, the second semiconductor layer includes AlGaN, the third semiconductor layer includes AlGaN, and the fourth semiconductor including AlGaN and having a band gap of 3 eV or more.

* * * * *